United States Patent
Williams

[11] Patent Number: 5,864,416
[45] Date of Patent: Jan. 26, 1999

[54] TUNING OPTICAL COMMUNICATIONS RECEIVER BY CONTROLLING DRAIN CURRENT INPUT TO VARIABLE TRANSCONDUCTANCE FET STAGE OF VARIABLE BANDWIDTH TRANSIMPEDANCE AMPLIFIER

[75] Inventor: Stephen G. Williams, Palm Bay, Fla.

[73] Assignee: Harris Corporation, Melbourne, Fla.

[21] Appl. No.: 725,302

[22] Filed: Oct. 2, 1996

[51] Int. Cl.$^6$ ............................................. H03F 3/08
[52] U.S. Cl. ..................... 359/189; 359/194; 359/195; 330/278; 330/308
[58] Field of Search ............................. 359/189, 194, 359/195; 455/254, 234.1; 330/59, 278, 279, 308, 285

[56] References Cited

U.S. PATENT DOCUMENTS

| | | | |
|---|---|---|---|
| 4,415,803 | 11/1983 | Muoi | 359/194 |
| 4,574,249 | 3/1986 | Williams | 359/194 |
| 5,012,202 | 4/1991 | Taylor | 359/194 |
| 5,239,402 | 8/1993 | Little, Jr. et al. | 359/189 |
| 5,477,370 | 12/1995 | Little et al. | 359/189 |
| 5,734,300 | 3/1998 | Yoder | 330/308 |

*Primary Examiner*—Edward Lefkowitz
*Attorney, Agent, or Firm*—Charles E. Wands

[57] ABSTRACT

A continuously tunable wideband optical communications receiver exhibits optimum performance across multiple octaves of received signal bandwidth. The receiver's transimpedance preamplifier input stage includes a variable transconductance field effect transistor, whose transconductance exhibits a very steep non-linear variation with drain current over the operational bandwidth of the transimpedance amplifier. As a result, the bandwidth of the transimpedance amplifier and therefore the receiver can be tuned to accommodate the detected data rate. The data rate of the received signal (known either a priori, or extracted by a clock recovery circuit) is used to adjust drain current and thereby tune the operational bandwidth of the receiver. A bandwidth control code look-up table previously stored in memory during a calibration phase of operation is employed by the receiver's microcontroller to generate a digital code representative of an control voltage to be output by a digitally programmable current control circuit. This control voltage is applied to a control port of the transimpedance amplifier so as to set the drain current supplied to the HJFET which, in turn, sets its transconductance, and thereby the effective operational bandwidth of the receiver.

20 Claims, 2 Drawing Sheets

5,864,416

TUNING OPTICAL COMMUNICATIONS RECEIVER BY CONTROLLING DRAIN CURRENT INPUT TO VARIABLE TRANSCONDUCTANCE FET STAGE OF VARIABLE BANDWIDTH TRANSIMPEDANCE AMPLIFIER

FIELD OF THE INVENTION

The present invention relates in general to a wideband optical communications receiver that is continuously tunable and exhibits optimum performance across multiple octaves of received signal bandwidth. For this purpose, the invention employs a transimpedance amplifier having a variable transconductance input gain stage, that is adjustable over multiple data rate octaves of the received signal by a drain control current derived from the receiver's clock/data recovery circuit, so as to tune the bandwidth of the receiver to accommodate the data rate of the received signal.

BACKGROUND OF THE INVENTION

Currently available optical communication receivers are designed to operate over a relatively limited passband of modulation data rates and are not readily tunable over multiple octaves of input signal frequency. Previous attempts to implement a broadband receiver have suffered from limited performance due to the substantial noise figure penalty that accumulates at data rates lower than the highest data rate at which the receiver is intended to operate.

One attempt to solve this problem involves the use of 'post' amplification stage, complex noise filtering circuitry downstream of the input signal amplifier. Unfortunately, such filters not only cannot improve upon the noise figure of the pre-amplifier stage, but they introduce an insertion loss penalty of their own, thereby reducing the overall sensitivity of the receiver. Another proposal has been to make the feedback resistor in the input stage's transimpedance amplifier controllably adjustable, for example, by means of a MOSFET-implemented resistor, whose applied gate voltage sets the effective resistance of the feedback resistor. This approach suffers from the fact that such an FET-implemented resistor has more insertion loss that the ordinary passive resistor it replaces. In addition, it introduces stray capacitance and thereby noise into the feedback path. Moreover, it does not provide multiple octave tunability.

SUMMARY OF THE INVENTION

In accordance with the present invention, the shortcomings of conventional bandwidth-limited optical communications receivers described above are effectively remedied by a wideband optical communications receiver that is continuously tunable and exhibits optimum performance across multiple octaves of received signal bandwidth. The invention is particularly directed to a modification of the receiver's transimpedance preamplifier input stage, upstream of the receiver's data/clock recovery circuitry. This modification involves the use of a variable transconductance device, in the form of a heterojunction field effect transistor HJFET, whose transconductance exhibits a very steep non-linear variation with drain current over the operational bandwidth of the transimpedance amplifier. By varying the drain current in accordance with the frequency of a data rate clock signal recovered by the data/clock recovery circuitry, the transconductance of the HJFET and thereby the bandwidth of the transimpedance amplifier can be tuned to accommodate the detected data rate.

As will be described, the invention uses the data rate of the received signal (known either a priori, or extracted by a clock recovery circuit) to tune the operational bandwidth of the receiver, such that the upper end of the bandwidth (its upper 3 dB) point is defined by the value of the transconductance $g_m$ of the HJFET preamplifier stage of the transimpedance amplifier. Being able to set the maximum bandwidth of the receiver to a value that is no greater than is necessary for the data rate of the received signal serves to optimize the noise overall figure of the receiver.

By the use of a bandwidth control code look-up table previously stored in memory during a calibration phase of operation, the receiver's microcontroller generates, either directly or interpolating between stored code values, a digital code representative of an control voltage to be output by a digitally programmable current control circuit. This control voltage is applied to a control port of the transimpedance amplifier so as to set the drain current supplied to the HJFET which, in turn, sets its transconductance, and thereby the effective operational bandwidth of the amplifier.

DETAILED DESCRIPTION

Figure 1:
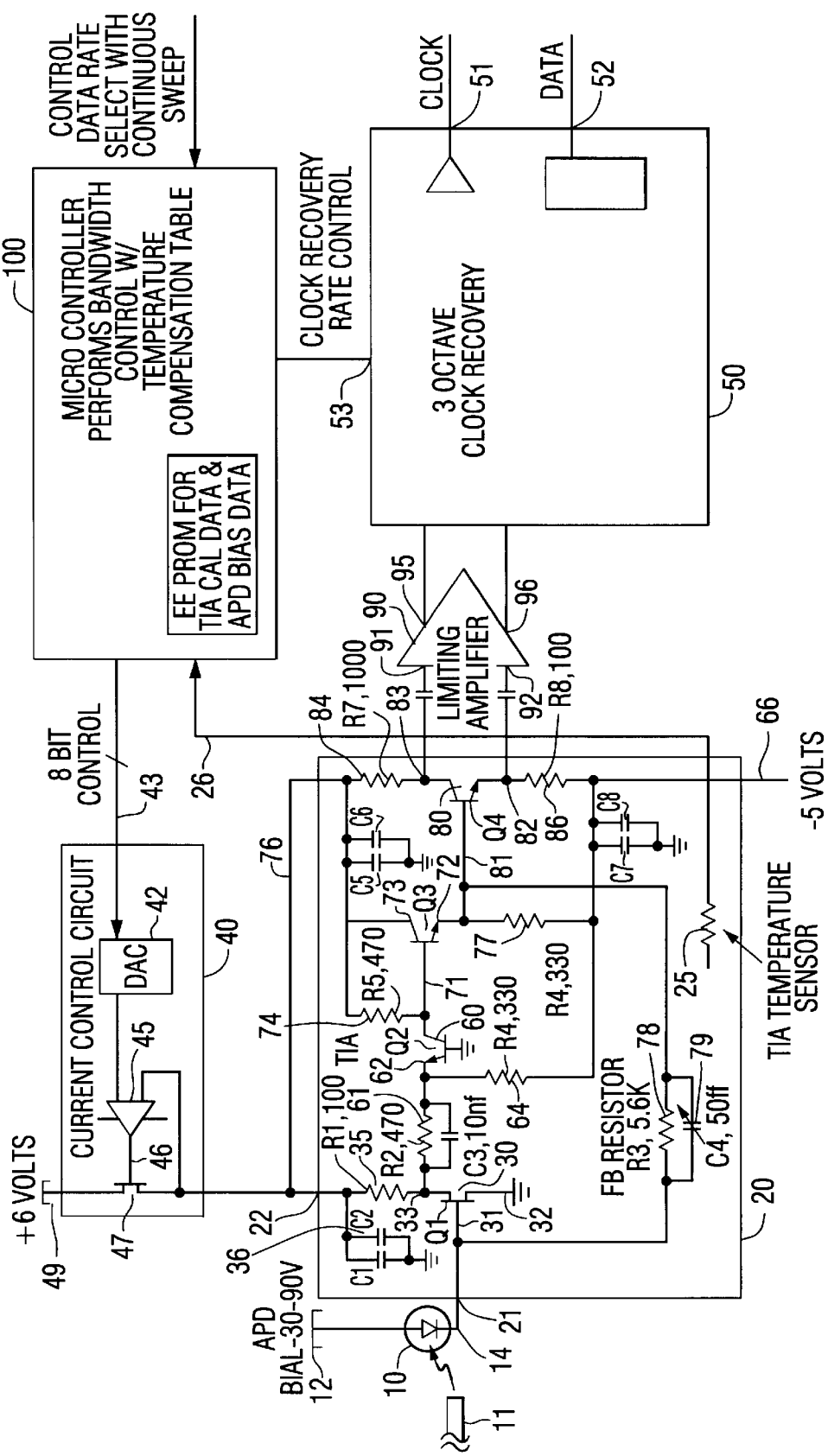
FIG. 1 is a schematic diagram of a continuously tunable, multi-octave optical communications receiver in accordance with a preferred embodiment of the present invention.

A continuously tunable, multi-octave optical communications receiver in accordance with a preferred embodiment of the present invention is schematically illustrated in FIG. 1 as comprising an opto-electronic transducer, shown as a photodiode 10, which is coupled to a light transmission signal path, such as a fiber optic link 11, by way of which (digitally) modulated communication signal is transported from an electro-optic transmitter (such as an injection laser diode) to the receiver. As a non-limiting example, the data rate of the data stream modulated upon the incoming light beam may be on the order of 100–800 Mb/s. When suitably biased, as by way of voltage bias source 12, photodiode 10 is operative to generate an output current representative of the digital data modulated upon the light beam incident on the photodiode 10.

Figure 2:
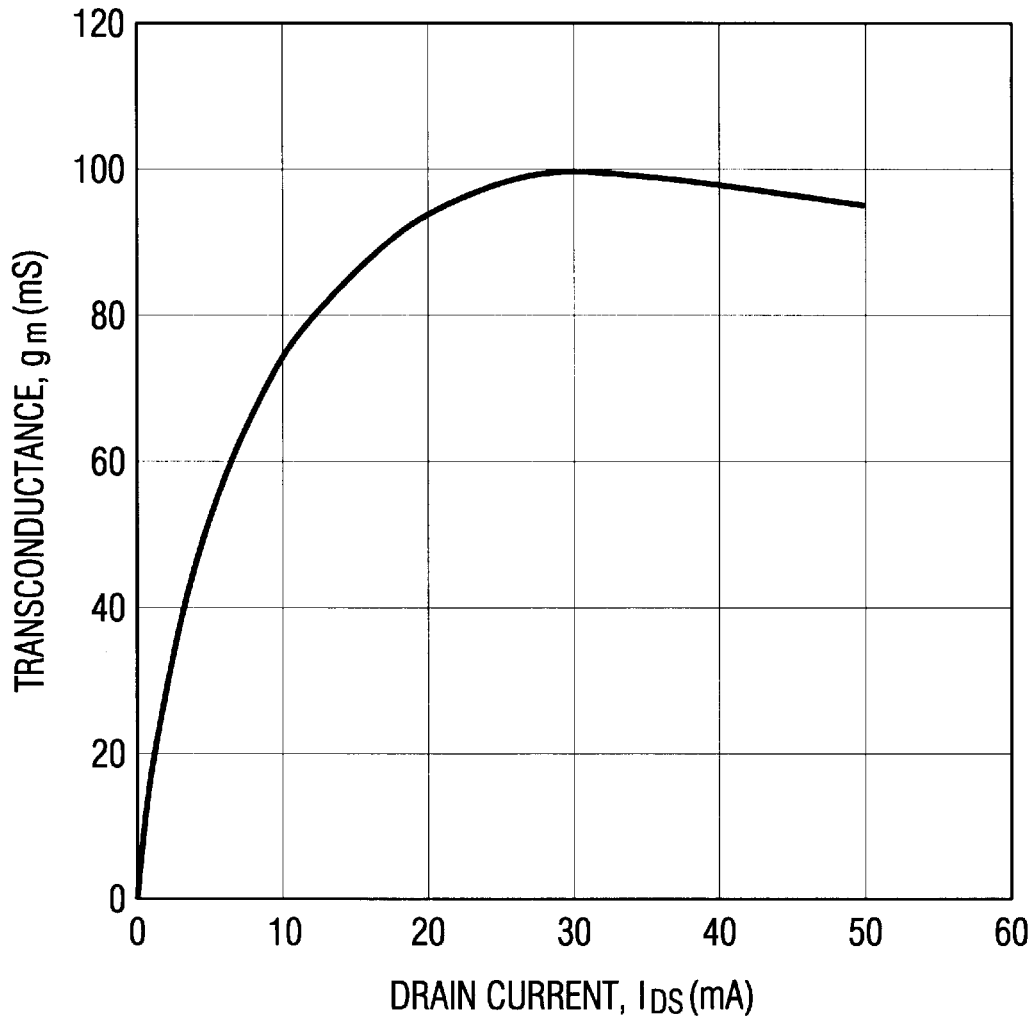
FIG. 2 shows the variation of transconductance with drain current of the heterojunction FET input stage in the transimpedance amplifier of the wideband receiver diagram of FIG. 1.

The cathode 14 of photodiode 10 is coupled to a signal input port 21 of a transimpedance amplifier 20. Amplifier 20 is configured as a multistage cascode follower circuit, and has an input port 21 coupled to a preamplification (phase inverter) stage 30, comprised of a controlled transconductance, preferably implemented as a heterojunction field effect transistor (HJFET) having a relatively steep transconductance vs. drain current characteristic, shown in FIG. 2. HJFET 30 has its gate 31 coupled to the input port 21 of the multistage transimpedance amplifier 20, and its source 32 coupled to a source of reference potential (e.g., ground). The drain 33 of FET 30 is coupled through a drain resistor 35 to bandwidth control port 22 of the transimpedance amplifier.

A noise by-pass capacitor circuit 36 is coupled between port 22 and ground.

As will be described, bandwidth control port 22 is supplied with a control voltage generated by a digitally programmable current control circuit 40, for controllably adjusting the drain current supplied to FET 30, and thereby its transconductance $g_m$. Since the transconductance $g_m$ of FET 30 effectively sets the maximum bandwidth of the transimpedance amplifier 20, the effective bandwidth of the receiver can be controlled by adjusting the drain current to the FET 30. The stimulus used to control the drain current to FET 30 is representative of the data rate of the received signal, as derived from a downstream clock/data recovery circuit 50.

The drain 33 of FET 30 is coupled through a resistor-capacitor filter 61 to the emitter 62 of a common-base connected transistor stage 60, the collector 63 of which is coupled to the base 71 of an emitter-follower transistor stage 70. An emitter bias resistor 64 is coupled between the emitter 62 of common-base connected transistor 60 a (VEE) bias supply line 66. The base 71 of emitter-follower transistor 70 is further coupled through base bias resistor 74 to a (VCC) voltage bias line 76, to which the collector 73 of transistor 70 is also coupled. An emitter bias resistor 77 is coupled between the emitter 72 of emitter follower transistor 70 to (VEE) bias supply line 66. A noise by-pass capacitor circuit 78 is coupled between VCC supply line 76 and ground. The cascode follower configuration of transimpedance amplifier 20 further includes a feedback resistor 78 (and parallel capacitor 79) coupled between the emitter output 72 of emitter follower transistor stage 70 and the gate drive input 31 of the initial, phase-inversion HJFET stage 30. As in a conventional cascode follower design, the value of feedback resistor 78 is set in accordance with the overall operational bandwidth of the amplifier. Namely, due to the feedback provided by resistor 78, controlling the value of the transconductance $g_m$ of the front end preamplifier gain stage of the HJFET 30 will have little or no effect on the overall passband gain of the amplifier. As pointed out above, the receiver of the invention may operate over a four octave variation in data rate (e.g., up to a data rate on the order of 800 Mb/s, for example).

The emitter 72 of emitter follower transistor 70 is further coupled to the base 81 of a downstream, phase-splitter output transistor stage 80, the emitter 82 and collector 83 outputs of which provide complementary phase outputs, that are capacitively coupled to respective opposite polarity ports 91 and 92 of a limiting amplifier stage 90. A collector bias resistor 84 is coupled between the collector 83 of transistor 80 and the VCC supply line 76, while an emitter bias resistor 86 is coupled between the emitter 82 of transistor 80 and the VEE supply line 66.

Transimpedance amplifier 20 may also include a temperature sensing resistor 25, which provides a calibration correction input via link 26 to a microcontroller 100, which is operative to generate a digital code defining the value of the control voltage generated by digitally programmable current control circuit 40, for controllably adjusting the drain current supplied to FET 30, for setting its transconductance, as described briefly above.

Limiting amplifier stage 90 has respective complementary polarity output ports 95 and 96 coupled to a conventional multi-octave data rate/clock recovery circuit 50, which extracts the clock signal embedded in the received data stream, as output by the transimpedance amplifier 20, and outputs respective data and clock signals at output ports 51 and 52. The operation of clock recovery circuit 50 is controlled via a control input 53 from control processor 100, either as a continuous sweep (in which the control processor 100 instructs the receiver at what data rate the clock recovery circuit is sweeping), or as a predefined data rate selection code.

As pointed out above, the present invention uses the data rate of the received signal (known either a priori, or extracted by the phase lock loop of clock recovery circuit 50), to tune the operational bandwidth of the receiver, such that the upper end of the bandwidth (its upper 3 dB) point is defined by the value of the transconductance $g_m$ of the HJFET preamplifier stage 30 of the transimpedance amplifier 20. Being able to set the maximum bandwidth of the receiver to a value that is no greater than is necessary for the data rate of the received signal serves to optimize the noise overall figure of the receiver.

For this purpose, using a bandwidth control code look-up table previously stored in memory during a calibration phase of operation, microcontroller 100 generates, either directly or interpolating between stored code values, an (eight bit) digital code representative of an control voltage to be output by digitally programmable current control circuit 40. As described above, this control voltage generated by current control circuit 40 is applied to the drain resistor 35 at the control port 22 of transimpedance amplifier 20, so as to set the drain current supplied to FET 30, which, in turn, sets its transconductance, and thereby the effective operational bandwidth of the amplifier.

In order to generate the intended drain current control voltage defined by the digital code supplied by microcontroller 100, digitally programmable current control circuit 40 includes a digital-to-analog converter (DAC) 42.

DAC 42 is coupled to receive the eight bit control code supplied on bus 43, and outputs an analog voltage through a driver amplifier 45 to control the magnitude of a control voltage supplied to the gate 46 of a voltage controlled resistor in the form of a MOSFET 47. MOSFET 47 effectively forms a voltage divider with the drain resistor 35 of HJFET 30. The drain 48 of voltage control FET 47 is coupled in common with its gate 46. FET 47 has its drain-source path coupled in circuit between a supply voltage terminal 49 and the control port 22 of transimpedance amplifier 20. As a consequence, with the gate voltage to FET 47 being defined in accordance with the value of the digital code generated by microcontroller 100, the resistance of FET 47 is varied, so as to vary the drain current through drain resistor 35 and thereby the transconductance of HJFET 30.

Preferably, HJFET 30 has a relatively steep transconductance vs. drain current characteristic, in which a relatively small variation in drain current will cause a significant change in $g_m$. For this purpose, HJFET may comprise a commercially available HJFET, such as part No. NE33200, manufactured by NEC, which exhibits the steep inverted parabolic curve shown in FIG. 2. As shown therein, on the relatively steep portion of the curve, a relatively small 10 mA variation in drain current (between 0 and 10 mA) produces a variation in transconductance $g_m$ of 80 mS, for a drain-source bias voltage of 2.0 V.

As described above, the digital code output by processor 100 is generated in accordance with one or more code values that have been previously stored in a look-up table during a calibration mode of operation. During this mode, the frequency of an input test signal supplied to transimpedance amplifier 20 is swept across the desired (three octave) bandwidth data sequence. During this sweep, microcontroller 100 generates respective code values associated with some prescribed plurality of calibration data points, which are stored in memory. The calibration values may take into account operational parameters, such as temperature of the transimpedance amplifier 20 and the operating point bias of the photodiode 10.

During real time operation, as the clock recovery circuit 110 determines the data rate embedded in the received signal, microcontroller 100 outputs a control code based upon the previously stored calibration table. Since only a limited number of data points are stored during calibration mode, processor 100 interpolates the required code value, for example by means of a conventional linear interpolation operation, and outputs therefrom an (eight bit) digital code representative of an control voltage to be output by digitally programmable current control circuit 40. As described earlier, the control voltage generated by current control circuit 40 is applied to the drain resistor 35 at the control port 22 of transimpedance amplifier 20, so as to set the drain current supplied to FET 30, which, in turn, sets its transconductance, and thereby the bandwidth of the receiver.

As will be appreciated from the foregoing description, the operational bandwidth limitations of conventional optical communications receivers described above are effectively overcome by the tunable wideband optical communications receiver of the present invention, which can be continuously adjusted with change in data rate, and exhibits optimum performance across multiple octaves of received signal bandwidth. By modifying the receiver's transimpedance preamplifier input stage to include a variable transconductance device, whose transconductance exhibits a very steep non-linear variation with drain current over the operational bandwidth of the transimpedance amplifier, the bandwidth of the transimpedance amplifier and therefore the receiver can be tuned to accommodate the detected data rate.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A transimpedance amplifier comprising an input terminal to which an input signal is coupled, an output terminal, and a variable bandwidth gain stage coupled between said input terminal and said output terminal, said variable bandwidth gain stage including a variable transconductance device having a variable transconductance that is operative to adjust the bandwidth of said variable bandwidth gain stage by a control stimulus applied thereto.

2. A transimpedance amplifier according to claim 1, wherein said variable transconductance device comprises a field effect transistor having a transconductance that exhibits a generally parabolic variation with a drain current thereof, as said control stimulus, over an operational bandwidth of said transimpedance amplifier.

3. A transimpedance amplifier according to claim 1, wherein said variable transconductance device comprises a heterojunction field effect transistor having a gate coupled to said input terminal, and a drain coupled to receive a drain current as said control stimulus, said heterojunction field effect transistor having a transconductance that exhibits a steep non-linear variation with drain current over an operational bandwidth of said transimpedance amplifier.

4. A transimpedance amplifier according to claim 3, further including a digitally driven drain current control circuit coupled to supply a digital code-defined drain current to said drain of said field effect transistor.

5. A transimpedance amplifier according to claim 3, wherein said input terminal is coupled to receive an output current generated by an opto-electronic transducer to which an optical communication signal is applied.

6. A tunable bandwidth communications receiver having a bandwidth that is tunable over multiple data rate octaves of a modulated communication signal received thereby comprising:

a transducer to which said modulated communication signal is applied, said transducer generating an output current representative of data modulated on said modulated communication signal;

a transimpedance amplifier having an input terminal to said output current is coupled, an output terminal, and a variable bandwidth gain stage coupled between said input terminal and said output terminal and including a variable transconductance device having a variable transconductance that is adjustable to vary said bandwidth of said receiver over said multiple data rate octaves of said modulated communication signal by a control stimulus applied thereto; and a multiple octave data recovery circuit, coupled to said output terminal of said transimpedance amplifier and being operative to derive said data modulated on said modulated communication signal.

7. A tunable bandwidth communications receiver, according to claim 6, further including a control processor having a look-up table, which stores a plurality of control codes associated with respective values of control stimulus for varying values of data rate, said control processor being operative to derive a digital code for defining a value of control stimulus to be supplied to said variable transconductance device, in accordance with the clock signal recovered by said multiple octave data recovery circuit and said plurality of control codes stored in said look-up table, so as to digitally tune the bandwidth of said communications receiver based upon said data rate.

8. A tunable bandwidth communications receiver according to claim 6, wherein said multiple octave data recovery circuit is operative to recover a clock signal associated with the data rate of said data modulated on said modulated communication signal, and wherein said variable transconductance of said variable transconductance device is adjusted in accordance with the clock signal recovered by said multiple octave data recovery circuit, so as to tune the bandwidth of said communications receiver to accommodate said data rate.

9. A tunable bandwidth communications receiver according to claim 8, wherein said variable transconductance device comprises a heterojunction field effect transistor having a gate coupled to said input terminal, and a drain coupled to receive a drain current as said control stimulus, said heterojunction field effect transistor having a transconductance that exhibits a steep non-linear variation with drain current over an operational bandwidth of said transimpedance amplifier.

10. A tunable bandwidth communications receiver, according to claim 8, wherein said variable transconductance device comprises a field effect transistor having a transconductance that exhibits a generally parabolic variation with a drain current thereof, as said control stimulus, over an operational bandwidth of said transimpedance amplifier.

11. A tunable bandwidth communications receiver, according to claim 10, further including a digitally driven drain current control circuit coupled to said multiple octave data recovery circuit, and being operative to supply a digital code-defined drain current to said drain of said field effect transistor in accordance with the clock signal recovered by said multiple octave data recovery circuit, so as to digitally tune the bandwidth of said communications receiver to accommodate said data rate.

12. A tunable bandwidth communications receiver, according to claim 11, wherein said digitally driven drain current control circuit includes a control processor having a look-up table, which stores a plurality of control codes associated with respective values of drain current for varying values of data rate, said control processor being operative to derive a digital code for defining drain current supplied to said drain of said field effect transistor, in accordance with the clock signal recovered by said multiple octave data recovery circuit and said plurality of control codes stored in said look-up table, so as to digitally tune the bandwidth of said communications receiver based upon said data rate.

13. A tunable bandwidth communications receiver, according to claim 6, wherein said transducer comprises an opto-electronic transducer to which a modulated optical communication signal is applied.

14. A method for tuning the bandwidth of a variable bandwidth communications receiver over multiple data rate octaves of a modulated communication signal received thereby, said receiver including a transducer to which said modulated communication signal is applied, said transducer generating an output current representative of data modulated on said modulated communication signal, a transimpedance amplifier having an input gain stage to which said output current is coupled, and a multiple octave data recovery circuit, coupled to said transimpedance amplifier and being operative to derive said data modulated on said modulated communication signal, comprising the steps of:

(a) configuring said input gain stage to include a variable transconductance device having a variable transconductance that establishes the bandwidth of said transimpedance amplifier and is adjustable to vary said bandwidth of said transimpedance amplifier and thereby the bandwidth of said variable bandwidth communications receiver over said multiple data rate octaves of said modulated communication signal by a control stimulus applied thereto; and (b) generating said control stimulus in accordance with a clock signal recovered by said multiple octave data recovery circuit, so as vary said variable conductance of said variable transconductance device and thereby tune the bandwidth of said communications receiver to accommodate said data rate.

15. A method according to claim 14, wherein step (b) comprises storing a plurality of control codes associated with respective values of control stimulus for varying values of data rate, and generating a digital code for defining a value of said control stimulus to be supplied to said variable transconductance device, in accordance with the clock signal recovered by said multiple octave data recovery circuit and said plurality of stored control codes, so as to digitally tune said variable conductance of said variable transconductance device and thereby the bandwidth of said communications receiver to accommodate said data rate.

16. A method according to claim 14, wherein said variable transconductance device comprises a heterojunction field effect transistor having a gate coupled to receive said modulated communication signal, and a drain coupled to receive a drain current as said control stimulus, said heterojunction field effect transistor having a transconductance that exhibits a steep non-linear variation with drain current over an operational bandwidth of said transimpedance amplifier.

17. A method according to claim 15, wherein said variable transconductance device comprises a field effect transistor having a transconductance that exhibits a generally parabolic variation with a drain current thereof, as said control stimulus, over an operational bandwidth of said transimpedance amplifier.

18. A method according to claim 15, wherein step (b) comprises coupling a digitally driven drain current control circuit to said multiple octave data recovery circuit, and causing said digitally driven drain current control circuit to supply a digital code-defined drain current to said drain of said field effect transistor in accordance with the clock signal recovered by said multiple octave data recovery circuit, so as to digitally tune the bandwidth of said communications receiver to accommodate said data rate.

19. A method according to claim 18, wherein said digitally driven drain current control circuit includes a control processor having a look-up table, which stores a plurality of control codes associated with respective values of drain current for varying values of data rate, and wherein step (b) comprises causing said control processor to derive a digital code for defining drain current supplied to said drain of said field effect transistor, in accordance with the clock signal recovered by said multiple octave data recovery circuit and said plurality of control codes stored in said look-up table, so as to digitally tune the bandwidth of said communications receiver based upon said data rate.

20. A method according to claim 14, wherein said transducer comprises an opto-electronic transducer to which a modulated optical communication signal is applied.

* * * * *